United States Patent [19]

Akiba et al.

[11] Patent Number: 5,429,710
[45] Date of Patent: Jul. 4, 1995

[54] DRY ETCHING METHOD

[75] Inventors: Hari Akiba; Shingo Kadomura, both of Kanagawa, Japan

[73] Assignee: Sony Corporation, Tokyo, Japan

[21] Appl. No.: 197,300

[22] Filed: Feb. 16, 1994

[30] Foreign Application Priority Data

Feb. 25, 1993 [JP] Japan .................... 5-061115

[51] Int. Cl.$^6$ .................. B44C 1/22; C23F 1/02; C03C 15/00
[52] U.S. Cl. .................... 216/17; 156/644.1; 216/41; 216/67; 216/79
[58] Field of Search ............... 156/643, 644, 646, 652, 156/657, 659.1, 662; 204/192.32, 192.37; 437/238

[56] References Cited

U.S. PATENT DOCUMENTS 5,176,790 1/1993 Arleo et al. .................... 156/643

Primary Examiner—William Powell
Attorney, Agent, or Firm—Hill, Steadman & Simpson

[57] ABSTRACT

A dry etching method for forming a connection opening in a insulating film of a silicon compound formed on an Al-based interconnection layer. The dry etching method consists in etching an $SiO_2$ interlayer insulating film on an Al-1% Si layer, in a magnetic micro-wave plasma etching device capable of generating a high-density plasma with an ion density of not less than $10^{11}$ ions/$cm^3$, using a c-$C_4F_8$/$CH_2F_2$ gas mixture. A layer of a reaction product having a low vapor pressure is generated on an exposed surface of the Al-1% Si layer at the time point when the connection opening is formed in the exposed surface of the Al-1% Si layer. For achieving high selectivity, the incident ion energy is adjusted so that the layer of the reaction product is not sputtered.

17 Claims, 3 Drawing Sheets under DRY ETCHING METHOD

BACKGROUND OF THE INVENTION

This invention relates to a dry etching method and, more particularly, to a method employed during etching for forming a connection hole in a silicon compound insulating film on an Al based interconnection layer for preventing the underlying Al-based interconnection layer from being sputtered off and re-deposited on the sidewall surface of the connection hole.

In a semiconductor device with a high integration degree and a high device density, such as VLSIs or ULSIs of recent origin, the proportion of the interconnection on a device chip has become higher. In order to prevent the resulting increase in the chip size, a multilevel interconnection process has become an indispensable technique. In the multilevel interconnection process, it is necessary to bore a through-hole in an interlayer insulating film between an upper interconnection layer and a lower interconnection layer as a via-hole for establishing electrical connection between the two layers.

As a material for the interlayer insulating film, a silicon oxide ($SiO_x$) based material is employed. The etching of an $SiC_x$ based material layer is generally carried out under conditions of producing a high incident ion energy for severing its strong Si-O bonds. That is, the etching mechanism of the $SiO_2$ material layer is comparable to a physical process, such as sputtering, rather than a chemical process, such as radical reaction.

Meanwhile, with an etching process accompanied by strong ion impact, the problem of the lowering of underground selectivity is presented inevitably. Above all, if a layer of the interconnection material susceptible to sputtering, such as the layer of the Al-based material, is present in the multilevel interconnection structure as an underlying layer for the insulating film, the surface of the interconnection material layer is sputtered and reduced in film thickness. Besides, products of the sputtering tend to be re-deposited on the inner wall surface of the via-hole to produce various problems.

The manner of the re-deposition in case the interconnection material layer is an Al-based material is explained by referring to FIGS. 1A to 1C. FIG. 1A shows a resist mask 13 formed on an $SiO_2$ interlayer insulating film 12 deposited on an Al-based interconnection layer 11. An opening 14 is formed in the resist mask 13 in accordance with a hole pattern.

It is now assumed that the $SiO_2$ interlayer insulating film 12 is etched under this condition to form a via-hole 15. The etching is performed in general under a higher incident energy condition and the underlying Al-based interconnection layer 11 is a layer of a material having a high sputtering rate. Consequently, the slightest overetching results in the exposed surface of the Al-based Interconnection layer 11 being sputtered, with the sputtered product being deposited on the sidewall surface of the via-hole 15 to form a re-deposited layer 16.

The re-deposited layer 16 is very difficult to remove and, even after removing the resist pattern 14 by ashing, the layer 16 is left in a state of being projected from an opening end of the via-hole 15, as shown in FIG. 1C. If a wafer is observed from its upper surface with an electron microscope, the re-deposited layer 16 looks like a royal crown, so that it is termed an aluminum crown.

The re-deposited layer 16, if peeled off or destroyed only partially, becomes a source of dust. Besides, if the layer 16 is protruded more or less from the upper most surface of the interlayer insulating film 12, an overlying layer tends to be affected in coverage to lower the yield of the semiconductor device significantly.

For preventing the underlying layer from being sputtered off as described above, a variety of methods have hitherto been proposed as countermeasures. One of these methods is to adopt an operating condition including a low self-bias potential $Y_{dc}$, while another method consists in adding a compound capable of etching the underlying layer of the interconnection material during overetching to the etching gas. Still another method consists in using a tapered cross-sectional shape of the via-hole.

Of these, the method of using a tapered cross-sectional shape of the via-hole is discussed in detail in Extended Abstract of 1990 Dry Process Symposium, pages 105 to 109, title number V-3. The etching of the $SiO_2$ interlayer insulating film is performed using a $CHF_3$ gas as the wafer is cooled to a temperature of approximately $-5°$ C. In other words, the etching proceeds as the effective mask width is perpetually increased by the deposition of an excess carbonaceous polymer, so that the via-hole presents an inclined sidewall surface. Since the sidewall is inclined in this manner, it becomes possible for the ions to be incident on the inclined surface, so that, even when the sputtering product derived from the underlying Al-based interconnection layer is re-deposited on the surface, it can be removed instantly. On the other hand, since the particles of the sputtering product are incident on such inclined surface at a small angle of incidence, the re-deposition itself is hardly produced.

However, the above-mentioned countermeasures are not without problems.

First, the method of lowering the self-bias potential $V_{dc}$ consists in lowering the incident ion energy to prevent incidental removal of the underlying interconnection layer. However, with the dry etching of recent origin, the prevalent concept is to achieve substantial anisotropy using a low pressure discharge plasma. As compared to the ion density in the conventional RF plasma, the ion density in the low pressure discharge plasma tends to be decreased because the ion density is acutely lowered in the RF plasma with decrease in the gas pressure. Consequently, this method is not effective to achieve a practically useful etch rate or throughput with the layer of the silicon compound for which an etching mechanism is based essentially on an ion-assisted reaction. While it is possible to accelerate the ions intentionally by increasing the input power or the substrate bias, the substrate tends to be damaged by the high energies afforded to the ions in this manner.

With the method of using a gas capable of etching the underlying interconnection material layer during overetching, it is possible to prevent the re-deposition. However, since the layer of the interconnection material is removed simultaneously, the aspect ratio of the via-hole is increased so that difficulties are raised in the subsequent plugging of the via-hole. In extreme cases, the layer of the interconnection material may be removed and eventually lost.

On the other hand, with the technique of providing a tapered cross-sectional shape of the via-hole, an excess amount of the carbonaceous polymer needs to be generated for achieving a significant taper, so that there is the risk of the particle level becoming undesirable. There is also raised another problem that the contact resistance between the layer of the electrically conductive material buried in the via-hole and the underlying layer of the interconnection material is increased because the bottom surface of the via-hole becomes narrower than the opening area in the mask.

Consequently, one has to make an extremely difficult selection of adopting an anisotropic cross-sectional shape of the via-hole and of achieving a practically useful etch rate while preventing wasteful etching, redeposition or damage done to the underlying interconnection layer.

For overcoming the above-mentioned difficulties, what may be demanded most strongly of the low-pressure discharge plasma includes an improved ionization ratio and controllability of the incidention energy.

OBJECTS AND SUMMARY OF THE INVENTION

It is therefore an object of the present invention to overcome the above-mentioned difficulties and to provide an etching method whereby a layer of a silicon compound may be etched on an Al-based interconnection layer with high anisotropy, high etch rate, high selectivity and low damage.

With the dry etching method of the present invention, selective etching of a silicon compound layer stacked on an Al-based interconnection layer is carried out in an etching chamber capable of generating a plasma with an ion density not less than $10^{11}$ ions/cm$^3$ with the use of an etching gas consisting mainly of a hydrocarbon compound under an incident ion energy condition in which at least a part of a layer of a reaction product produced on an exposed surface of the Al-based interconnection layer is left.

Examples of the plasma having the ion density not less than $10^{11}$ ions/cm$^3$ include an ECR plasma, heliconwave plasma, inductive coupling plasma (ICP), a hollow anode plasma and helical resonator plasma.

With the method of the present invention, the layer of the reaction product is removed after the end of the etching with the use of an etching gas containing a chlorine compound.

With the method of the present invention, after removing the layer of the reaction product using the etching gas containing the chlorine compound as described above, the residual chlorine is removed simultaneously with the resist mask employed for the previous etching.

With the method of the present invention, ashing is carried out under high vacuum in continuation to removal of the reaction product layer for removing the residual chlorine simultaneously with the resist mask employed for the previous etching.

Also, with the method of the present invention, plasma processing is carried out under high vacuum in continuation to removal of the reaction product layer using a gas containing a hydrogen atom containing compound in its molecule for removing the residual chlorine as the chlorine is reacted with hydrogen-based chemical species.

For generating the plasma, the collision between electrons and gas atoms is indispensable. The high density plasma employed in the present invention is such a plasma in which contrivances have been made to increase the number of times of such collision as compared to the plasma known heretofore. The plasma known heretofore is excited by applying an RF power across parallel flat electrode plates for producing glow discharge or by supplying the micro-wave to a wave guide for generating microwave discharge. With the high density plasma, gas dissociation is promoted to achieve a high ion density by taking advantage of electron cyclotron resonance based on the interaction between the micro-wave electric field and the magnetic field or a micro-wave propagation mode in the magnetic field known as the Whistler mode.

With the high density plasma employed in the present invention, it is necessary for the incident ion energy to be controllable. To this end, it is desirable that the high density plasma be a so-called remote plasma, that is a plasma of the type in which plasma generation by the electric discharge and the control of the incident ion energy may be performed independently of each other.

If the high density plasma with an ion density of not less than $10^{11}$ ions/cm$^3$ is generated using an etching gas consisting mainly of the fluorocarbon compound, dissociation of the fluorocarbon compound proceeds more outstandingly than in the conventional RF plasma, even under a reduced pressure, such that a large quantity of $CF_x^+$, mainly with $x=1$, are generated highly efficiently. The layer of the silicon compound is etched at a practically useful rate by being assisted by the abundant supply of these ions.

If the underlying Al-based interconnection layer is exposed with the progress of etching, the etching is terminated at this time point, due to coating of the exposed surface of the Al-based interconnection layer with a layer of a low vapor pressure reaction product containing at least $AlF_x$, with typically $x=3$, as has been confirmed experimentally. Besides, since the incident ion energy is optimized with the present method for minimizing the sputtering rate of the reaction product layer, the latter may be used as a surface protection film for the underlying Al-based interconnection layer. Consequently, even when collectively forming a number of connection holes of different depths, the underlying Al-based interconnection layer may be protected from excess overetching even for the connection holes of shallow depths, thus preventing the occurrences of so-called aluminum crowns.

Meanwhile, the reaction product layer may be easily removed in the form of $AlCl_x$ by employing an etching gas containing a chlorine compound.

However, if the chlorine compound is employed, chlorine is necessarily left in the reaction system after removal of the reaction layer. Such residual chlorine tends to cause the after-corrosion of the Al-based interconnection layer when the wafer is contacted with the moisture on being exposed to atmospheric air. Consequently, it is necessary to remove the residual chlorine by a process consecutive to the etching without allowing the as-etched wafer to be exposed to atmosphere.

For removing the residual chlorine, the present invention provides two methods, namely the method of ashing the resist mask employed as an etching mask, and the method of plasma processing by a compound containing a hydrogen atom in its molecule.

With the ashing method, the resist pattern containing a large quantity of occluded chlorine is removed for significantly reducing the amount of the residual chlorine on the wafer. On the other hand, with the plasma processing method, hydrogen-based chemical species, such as H*, generated from the compound containing a hydrogen atom in its molecule, are reacted with the residual chlorine, so that the residual chlorine is removed promptly in the form of hydrogen chloride (HCl).

BRIEF DESCRIPTION OF THE DRAWINGS

FIG. 2A shows the state in which the $SiO_2$ interlayer insulating film and the resist mask are formed step by step on an Al-1%Si layer, FIG. 2B shows the state in which just-etching of the SiO₂ interlayer insulating film has come to an end, FIG. 2C shows the state in which a reaction product layer has been formed on an exposed surface of the Al-1%Si layer, and FIG. 2D shows the state in which chlorine is left as the reactive layer is removed.

DETAILED DESCRIPTION OF THE PREFERRED EMBODIMENTS

The present invention will be hereinafter explained with reference to several illustrative Examples.

EXAMPLE 1

The present Example is directed to a process of forming a via-hole in an interlayer insulating film on an Al-1% Si layer using a magnetic micro-wave plasma etching device. In the above process, two-step etching of the interlayer insulating film is carried out using a c-C₄F₈/CH₂F₂ mixed gas system and a c-C₄F₈ sole gas system. Subsequently, a layer of a reaction product formed on an exposed surface of the Al-1% Si layer is removed by plasma processing employing Cl₂, and a resist ashing -residual chlorine removing step is carried out in an in-line ashing device connected under high vacuum to the micro-wave plasma etching device. The process is hereinafter explained by referring to FIGS. 2A to 2D and FIG. 3.

Figure 1A:
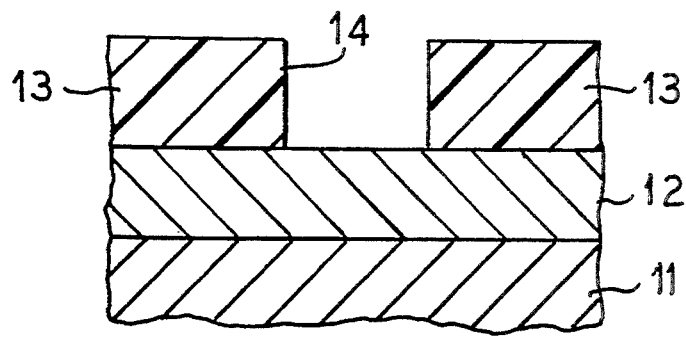
FIG. 1A is a cross-sectional view for illustrating the problem met in the formation of a via-hole and showing the state in which an SiO₂ interlayer insulating film and a resist mask are formed step by step on an Al-based interconnection layer.
Figure 1B:
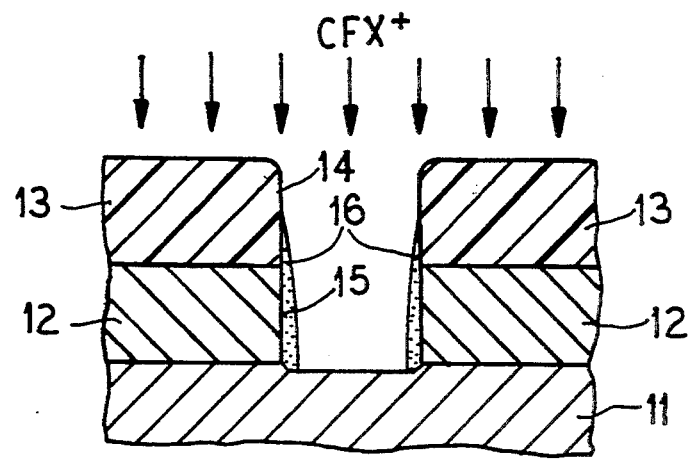
FIG. 1B is a cross-sectional view showing the state in which the surface of the Al-based interconnection layer is sputtered during overetching to form a re-deposited layer.
Figure 1C:
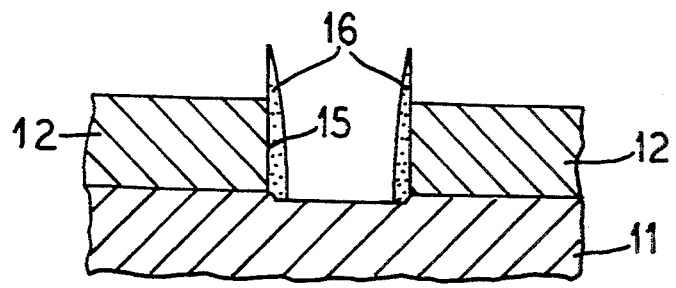
FIG. 1C is a cross-sectional view showing the state in which the re-deposited layer is left after removal of the resist pattern.
Figure 2A:
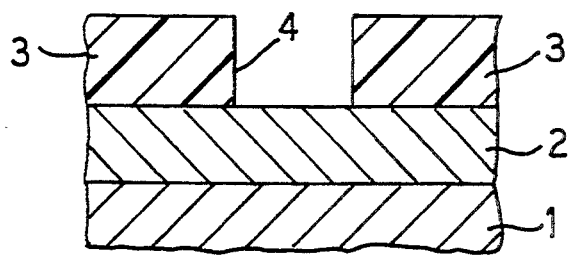
FIGS. 2A to 2D are cross-sectional views showing the dry etching method of the present invention, as applied to the formation of the via-hole, step by step, where

FIG. 2A shows a wafer employed as an etching sample in the present Example 1. This wafer comprises an Al-1% Si layer 1, an SiO₂ interlayer insulating film 2 thereon, having a thickness of approximately 0.6 μm, and a resist mask 3 thereon patterned to a pre-set shape. The resist mask 3 has a thickness of approximately 1.0 μm, while an opening 4, formed in accordance with a hole pattern, is approximately 0.4 μm in diameter.

The above-described wafer was set on a magnetic micro-wave plasma etching device to perform two-stage etching of the SiO₂ interlayer insulating film 2. The two-stage etching means an etching method in which the etching process is divided into a just-etching partial process until substantial exposure of an underlying layer and an overetching partial process until complete exposure of the underlying layer, with the etching conditions being switched between these two partial processes.

As an example, the SiO₂ interlayer insulating film 2 was just-etched under the following conditions.

| c-C₄F₈ flow rate: | 20 SCCM |
|---|---|
| CH₂F₂ flow rate: | 10 SCCM |
| gas pressure: | 0.25 Pa |
| micro-wave power: | 1200 W (2.45 GHz) |
| RF bias power | 300 W (800 kHz) |
| electrode temperature | −50° C. (alcoholic cooling medium was used) |

It is noted that c-C₄F₈ is a fluorocarbon compound having a higher C/F ratio of the molecule (ratio of the number of C atoms to that of F atoms) and capable of yielding a large amount of $CF_x^+$, mainly with x=2, when allowed to stand in a conventional magnetron RIE device having a plasma ion density on the order of $10^{10}$ ions/cm³. However with the magnetic micro-wave plasma device employed in the present Example, gas dissociation proceeds further such that a high-density ECR plasma is formed, the ion density of which is on the order of $10^{11}$ ions/cm³.

However, the predominant chemical species generated in the ECR plasma are CF+ dissociated further from $CF_x^+$, with the amount of F* being increased concomitantly. Thus, CH₂F₂ is added to the reaction system with a view to supplying H* to the plasma for capturing excess F*. Besides CH₂F₂ tends to deposit a carbonaceous polymer. Consequently, with the above gas system, resist selectivity is improved based on the carbonaceous polymer deposition effect and the F* decreasing effect.

Figure 2B:
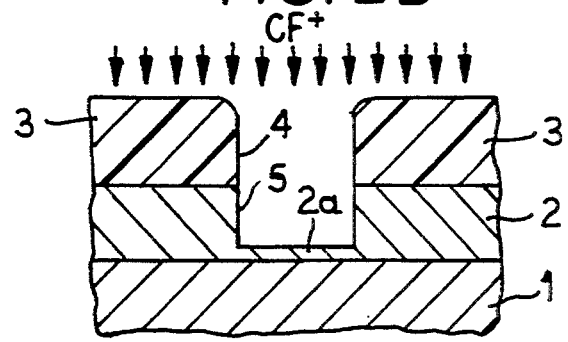

With the above-described just-etching system, the RF power density is set to a lower value so that the incident ion energy is weakened to a necessary minimum value. However, the etching proceeded anisotropically and at a practically useful rate by CF+ yielded at a high density. The just-etching was terminated directly before exposure of the underlying Al-1%Si layer 1, as shown in FIG. 2B. Thus a via-hole was formed only halfway.

Then, for removing a residual portion 2a of the interlayer insulating film 2, an overetching was performed under the following typical conditions:

| c-C₄F₈ flow rate: | 30 SCCM |
|---|---|
| gas pressure: | 0.25 Pa |
| micro-wave power: | 1200 W (2.45 GHz) |
| RF bias power: | 220 W (800 kHz) |
| electrode temperature: | −50° C. (alcoholic cooling medium was used) |

Figure 2C:
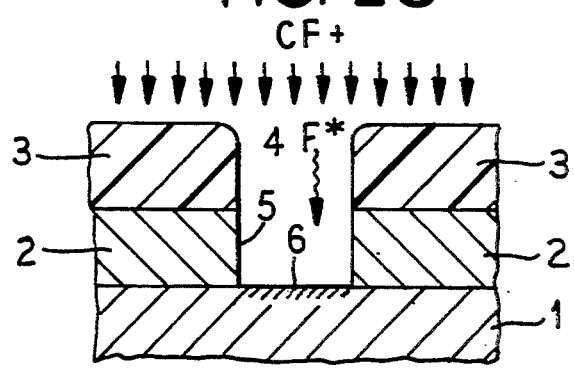

Since CH₂F₂ is eliminated from the gas composition during the overetching process for lowering the C/F ratio in the etching reaction system, the amount of F* yielded in the plasma was increased as compared with that for the just-etching process. Thus, when the Al-1% Si layer is exposed on the bottom surface of the via-hole 5, as shown in FIG. 2C, a layer of the reaction product 6 was generated quickly on the exposed surface. This layer of the reaction product 6 exhibited high resistance against attack by ions or radicals because of the low vapor pressure and the low sputtering rate under the above-mentioned etching conditions. Consequently, the surface of the Al-1% Si layer 1 was effectively protected during the overetching.

However, the layer of the reaction product 6, if left as it is, tends to increase the contact pressure. Thus the layer 6 was removed under the following typical conditions:

| | |
|---|---|
| $Cl_2$ low rate: | 100 SCCM |
| gas pressure: | 2.0 Pa |
| micro-wave power: | 1200 W (2.45 GHz) |
| RF bias power: | 90 W (800 kHz) |
| electrode temperature | −10° C. (alcoholic cooling medium was used) |

Figure 2D:
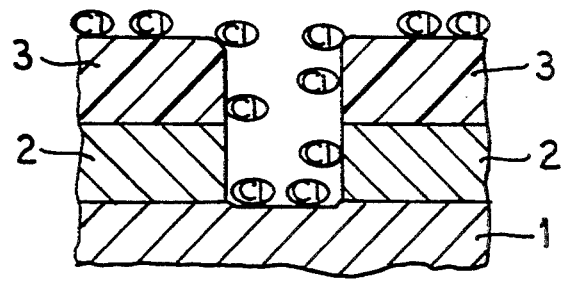
Figure 3:
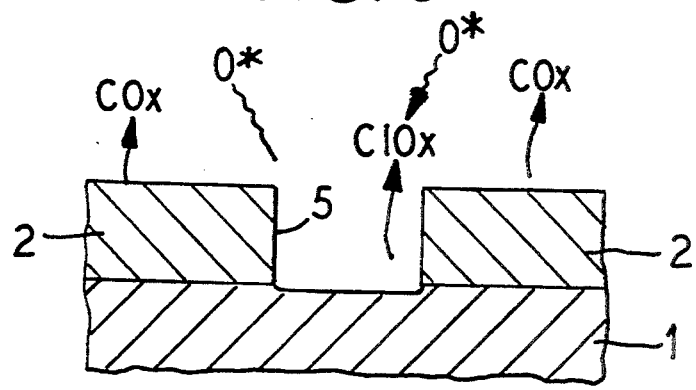
FIG. 3 is a schematic cross-sectional view showing the state in which the resist mask and residual chlorine have been removed from the state shown in FIG. 2D.
Figure 4:
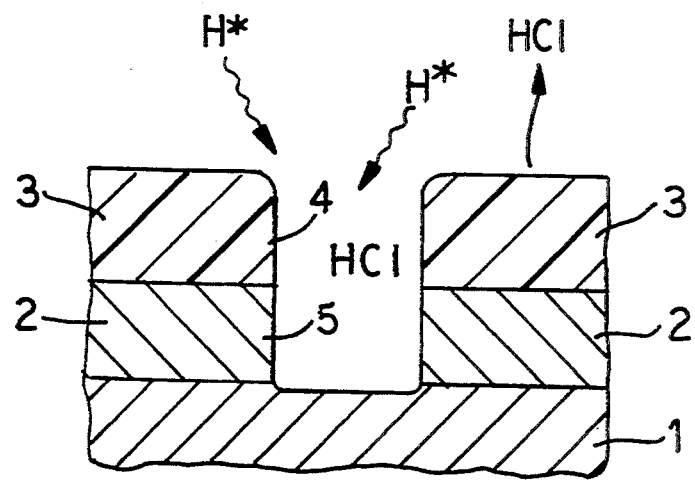
FIG. 4 is a schematic cross-sectional view showing the state in which the residual chlorine has been removed by plasma processing employing a compound containing a hydrogen atom.

By this etching, the layer of the reaction product 6 was removed, as shown in FIG. 2D. Since chlorine-based chemical species are used at this time as an etchant, there is the possibility of the Al-1% Si layer 1 being removed in a minor quantity in the form of $AlCl_x$. However, since this etching was carried out for a shorter time under conditions of extremely weak incident ion energies, the subsequent process of plugging the via-hole 5 was not affected significantly. Rather, the merit of preventing the formation of Al crowns by the presence of chlorine-based chemical species is outstanding.

Meanwhile, chlorine was left on the wafer surface on termination of etching.

The wafer was then transferred to an in-line ashing device, connected to the magnetic micro-wave plasma etching device via a vacuum load-lock device, for ashing the resist mask 3 under the following typical conditions:

| | |
|---|---|
| $O_2$ flow rate: | 100 SCCM |
| gas pressure: | 5.0 Pa |
| RF bias power: | 0 W |
| ashing time: | 120 sec |

In the present Example, the wafer was not opened to atmosphere on termination of etching of the $SiO_2$ interlayer insulating film 2. Thus the wafer was transferred into the ashing device with substantially no water adsorbed on its surface. The major portion of the residual chlorine on the wafer was removed with the removal of the resist mask 3.

After the ashing, the wafer was tentatively allowed to stand in atmospheric air. After 72 hours, no post-corrosion was observed to be produced.

EXAMPLE 2

In the present Example, an $SiO_2$ interlayer insulating film was etched in one step for formation of a via-hole, using c-$C_4F_8$. After the layer of a reaction product formed on an exposed surface of the Al-1% Si layer was etched off using a $BCl_3/Cl_2$ mixed gas, residual chlorine was removed by plasma processing using an $H_2$ gas. This process is explained by referring to FIGS. 2A, 2C, 2D and 4.

First, a wafer shown in FIG. 2A was set on a magnetic micro-wave plasma etching device for etching an $SiO_2$ interlayer insulating film 2 under the following typical conditions:

| | |
|---|---|
| c-$C_4F_8$ low rate: | 30 SCCM |
| gas pressure: | 0.25 Pa |
| micro-wave power: | 1200 W (2.45 GHz) |
| RF bias power: | 250 W (800 kHz) |
| electrode temperature: | −10° C. (alcoholic cooling medium was used) |

Since $CH_2F_2$ is not added to the gas system, the amount of F* yielded in the etching reaction system is more than that for Example 1, such that the layer of the reaction product 6 could be formed as soon as the Al-1% Si layer 1 was exposed. However, since the etching is carried put in one step, the RF power was set to a lower value than in Example 1 for assuring practically useful selectivity. By this etching, the via-hole 5 having an anisotropic shape as shown in FIG. 2C was formed, and the layer of the reaction product 6 was formed on its bottom surface.

Then, for removing the layer of the reaction product 6, etching was performed under the following typical conditions:

| | |
|---|---|
| $BCl_3$ flow rate: | 100 SCCM |
| $Cl_2$ flow rate: | 50 SCCM |
| gas pressure: | 2.0 Pa |
| micro-wave power: | 1200 W (2.45 GHz) |
| RF bias power: | 50 W (800 kHz) |
| electrode temperature: | −10° C. (alcoholic cooling medium was used) |

By this etching, the layer of the reaction product 6 was removed quickly by the contribution of the chlorine-based chemical species. Meanwhile, the above gas composition is a composition widely known as an etching gas for the Al-based material layer. Even when a native oxide film is produced on the surface of the Al-1% Si layer 1 under the effect of the residual oxygen, such native oxide film may be quickly removed based on the reduction effect provided by $BCl_3$.

Then, for removing residual oxygen generated with the removal of the layer of the reaction product 6, plasma processing was carried out under the following typical conditions:

| | |
|---|---|
| $H_2$ flow rate: | 30 SCCM |
| gas pressure: | 0.25 Pa |
| micro-wave power: | 1200 W (2.45 GHz) |
| RF bias power: | 20 W (800 kHz) |
| electrode temperature: | −10° C. (alcoholic cooling medium was used) |
| plasma processing time | 20 sec |

With the plasma processing process, residual chlorine was removed in the form of hydrogen chloride HCl by H* yielded from $H_2$. The wafer, when left to stand in atmosphere for 72 hours, was not susceptible to after-corrosion.

Although the present invention has been described with reference to two Examples, the present invention is not limited to these merely illustrative Examples.

As for the Al-1% Si layer, employed as the Al-based interconnection layer in the above Examples, an antireflection film, such as TiON film, may be employed in conjunction with the Al-based interconnection layer, in consideration that such anti reflection film is used in a majority of cases in connection with the Al-based interconnection layer for improving processing accuracy in photolithography.

Although the interlayer insulating film composed of $SiO_2$ is given as an illustrative example, an interlayer insulating film composed e.g. of PSG, BSG, BPSG, AsSG, AsPSG or AsBSG may similarly be etched.

The chlorine-based compounds of $Cl_2$ or $BCl_3$, employed for etching the layer of the reaction product, may be replaced by HCl, as an example.

As the hydrogen atom containing compound, employed for removing residual chlorine, $NH_3$ or various hydrocarbons, such as $CH_4$, may also be employed besides $H_2$ mentioned above.

Although the ECR plasma is employed as the high-density plasma in the above-described embodiments, the ion density on the order of $10^{12}/cm^3$ has been reported with a hollow anode type plasma, while the ion density on the order of $10^{12}$ to $10^{13}$ ions/$cm^3$ has similarly been reported for a helicon wave plasma or TCP. Any of these plasmas may be employed for the present invention.

Besides, the etching devices employed, etching conditions, sample wafer composition or the plasma processing conditions may also be changed, if so desired.

What is claimed is:

1. A dry etching method of selectively etching a silicon-containing dielectric layer formed on an interconnection layer of an Al-based alloy, comprising the steps of
    providing a patterned masking material on the silicon-containing dielectric layer to expose an area of said silicon-containing dielectric layer,
    first etching the exposed area of said silicon-containing dielectric layer in an etching chamber using a first etching gas under a condition that at least a minor amount of a layer of a reaction product formed on an exposed surface of the Al-based alloy interconnection layer is left, said first etching gas comprising a fluorocarbon compound as a main constituent, and
    then removing said layer of the reaction product after the end of said first etching step, by a second etching using second etching gas comprising a chlorine compound.

2. The dry etching method as claimed in claim 1 wherein said etching chamber is capable of generating a plasma with an ion density of not less than $10^{11}$ ions/$cm^3$.

3. The dry etching method as claimed in claim 1 wherein said first etching step of performs the etching until said Al-based alloy interconnection layer starts to be substantially exposed and said second etching step performs the etching until the surface of said Al-based alloy interconnection layer is completely exposed.

4. The dry etching method as claimed in claim 1 wherein said Al-based alloy interconnection layer comprises an anti reflection layer on its surface.

5. The dry etching method as claimed in claim 1 wherein said first etching gas is at least one of $CF_4$, $C_2F_6$ and $C_4F_8$.

6. The dry etching method as claimed in claim 1 wherein said layer of the reaction product acts as an etching stop.

7. The dry etching method as claimed in claim 1 wherein said silicon-containing dielectric layer is formed of a material selected from the group consisting of silicon dioxide, PSG, BSG, BPSG, AsSG, AsPSG and AsBSG.

8. The dry etching method as claimed in claim 1 wherein said condition is such a condition in which the incident ion energy is controlled so as not to produce sputtering of said layer of the reaction product.

9. The dry etching method as claimed in claim 1 wherein said second etching gas is at least one of $Cl_2$, $BCl_2$ and HCl.

10. The dry etching method as claimed in claim 1 wherein said etching chamber comprises a plasma source and means for controlling the incident ion energy independently of said plasma source.

11. A dry etching method according to claim 1, which further includes the step of removing any residual chlorine after the step of removing the reaction product with the second etching gas.

12. The dry etching method as claimed in claim 11 wherein said step of removing the residual chlorine is an ashing step carried out under a high vacuum in succession to removal of said layer of the reaction product for removing both said masking material and said residual chlorine.

13. The dry etching method as claimed in claim 11 wherein said step of removing the residual chlorine is a plasma processing step carried out under a high vacuum in succession to removal of said layer of the reaction product using a gas containing a hydrogen atom in the molecule thereof, whereby hydrogen-based chemical species are reacted with said residual chlorine for removing said residual chlorine.

14. The dry etching method as claimed in claim 13 wherein said gas containing a hydrogen atom in the molecule thereof is at least one of $Cl_2$, $NH_3$ and hydrocarbons.

15. A method for producing a semiconductor device having via-holes comprising the steps of
    forming an electrically conductive interconnection layer mainly composed of an Al-based material,
    forming a silicon-containing dielectric layer on said interconnection layer,
    applying a resist film on said silicon-containing dielectric layer to provide at least one exposed area,
    first etching an exposed area of said silicon-containing dielectric layer in an etching chamber for forming the via-hole using a first etching gas composed of a fluorocarbon material under a condition that at least a part of a layer of a reaction product of said etching gas with an element contained in said interconnection layer is left, and
    removing said layer of the reaction product, after the end of said first etching step, using a second etching gas comprising a chlorine compound.

16. The method for producing a semiconductor device as claimed in claim 15 wherein said etching chamber is capable of generating a plasma having an ion density of not less than $10^{11}$ ions/$cm^3$.

17. A method according to claim 15, which includes subsequently removing any residual chlorine.

* * * * *